(12) United States Patent
Xu et al.

(10) Patent No.: US 9,916,919 B2
(45) Date of Patent: Mar. 13, 2018

(54) SUPERCONDUCTING WIRES AND METHODS OF MAKING THEREOF

(71) Applicants: THE OHIO STATE UNIVERSITY, Columbus, OH (US); HYPER TECH RESEARCH, INC., Columbus, OH (US)

(72) Inventors: Xingchen Xu, Columbus, OH (US); Michael D. Sumption, Newark, OH (US); Xuan Peng, Dublin, OH (US)

(73) Assignees: Ohio State Innovation Foundation, Columbus, OH (US); Hyper Tech Research, Inc., Columbus, OH (US)

( * ) Notice: Subject to any disclaimer, the term of this patent is extended or adjusted under 35 U.S.C. 154(b) by 0 days.

(21) Appl. No.: 15/119,831

(22) PCT Filed: Feb. 18, 2015

(86) PCT No.: PCT/US2015/016431
§ 371 (c)(1),
(2) Date: Aug. 18, 2016

(87) PCT Pub. No.: WO2015/175064
PCT Pub. Date: Nov. 19, 2015

(65) Prior Publication Data
US 2017/0062099 A1    Mar. 2, 2017

Related U.S. Application Data

(60) Provisional application No. 61/941,347, filed on Feb. 18, 2014.

(51) Int. Cl.
*H01B 12/10* (2006.01)
*H01F 6/06* (2006.01)
(Continued)

(52) U.S. Cl.
CPC .............. *H01B 12/10* (2013.01); *B22F 5/12* (2013.01); *B22F 7/04* (2013.01); *C22C 1/0491* (2013.01);
(Continued)

(58) Field of Classification Search
CPC ........ H01B 12/00; H01B 12/10; H01B 12/02; H01B 13/0016; H01L 39/12; H01L 39/2403; H01L 39/2406; H01L 39/2409
See application file for complete search history.

(56) References Cited

U.S. PATENT DOCUMENTS 3,429,032 A    2/1969   Martin et al.
4,990,411 A *  2/1991   Nakayama .............. H01L 39/14
                                                    148/98

(Continued)

OTHER PUBLICATIONS

Dietderich (NPL: Nb3Sn research and development in the USA-wires and cables) 2008.*

(Continued)

*Primary Examiner* — Timothy Thompson
*Assistant Examiner* — Amol Patel
(74) *Attorney, Agent, or Firm* — Meunier Carlin & Curfman LLC (57) ABSTRACT

Disclosed herein are superconducting wires. The superconducting wires can comprise a metallic matrix and at least one continuous subelement embedded in the matrix. Each subelement can comprise a non-superconducting core, a superconducting layer coaxially disposed around the non-superconducting core, and a barrier layer coaxially disposed around the superconducting layer. The superconducting layer can comprise a plurality of $Nb_3Sn$ grains stabilized by metal oxide particulates disposed therein. The $Nb_3Sn$ grains can have an average grain size of from 5 nm to 90 nm (for example, from 15 nm to 30 nm). The superconducting wire can have a high-field critical current density ($J_c$) of at least (Continued)

5,000 A/mm² at a temperature of 4.2 K in a magnetic field of 12 T. Also described are superconducting wire precursors that can be heat treated to prepare superconducting wires, as well as methods of making superconducting wires.

13 Claims, 4 Drawing Sheets

(51) Int. Cl.
*H01B 13/00* (2006.01)
*C22F 1/18* (2006.01)
*C22C 1/04* (2006.01)
*H01L 39/14* (2006.01)
*H01L 39/24* (2006.01)
*B22F 5/12* (2006.01)
*B22F 7/04* (2006.01)
*C22C 32/00* (2006.01)

(52) U.S. Cl.
CPC ........... *C22F 1/18* (2013.01); *H01B 13/0016* (2013.01); *H01F 6/06* (2013.01); *H01L 39/14* (2013.01); *H01L 39/2409* (2013.01); *C22C 32/0031* (2013.01)

(56) References Cited

U.S. PATENT DOCUMENTS

| | | |
|---|---|---|
| 2003/0085053 A1 | 5/2003 | Benz et al. |
| 2003/0168246 A1 | 9/2003 | Benz et al. |
| 2006/0073979 A1 | 4/2006 | Thieme et al. |
| 2006/0081307 A1* | 4/2006 | Field .................. H01L 39/2409 148/98 |

OTHER PUBLICATIONS

International Preliminary Report on Patentability of the International Bureau of WIPO, Application No. PCT/US2015/016431, dated Aug. 23, 2016, 9 pages.
International Search Report and Written Opinion of the International Searching Authority, Application No. PCT/US2015/016431, dated Oct. 30, 2015, 11 pages.
Dietderich, D. R., & Godeke, A. (2008). Nb 3 Sn research and development in the USA—Wires and cables. Cryogenics, 48(7), 331-340.
Rumaner, L. E., Benz, M. G., & Hall, E. L. (1994). The role of oxygen and zirconium in the formation and growth of Nb3sn grains. Metallurgical and Materials Transactions A, 25(1), 213-219.
Zeitlin, B. A., Gregory, E., Marte, J., Benz, M., Pyon, T., Scanlan, R., & Dietderich, D. (2005). Results on mono element internal tin Nb 3 Sn conductors (MEIT) with Nb7. 5Ta and Nb (1Zr+ O x) filaments. IEEE transactions on applied superconductivity, 15(2), 3393-3398.

* cited by examiner

SUPERCONDUCTING WIRES AND METHODS OF MAKING THEREOF

CROSS-REFERENCE TO RELATED APPLICATIONS

This application claims benefit of U.S. Provisional Application No. 61/941,347, filed Feb. 18, 2014, which is hereby incorporated herein by reference in its entirety.

STATEMENT REGARDING FEDERALLY SPONSORED RESEARCH

This invention was made with government support under Grant No. DE-FG02-95ER40900 awarded by the United States Department of Energy and under Grant No. DE-SC0006250 awarded by the United States Department of Energy. The government has certain rights in this invention.

BACKGROUND

Superconductivity is a phenomenon occurring in certain materials below certain temperatures, characterized by zero electrical resistance and expulsion of magnetic fields. Superconducting magnets are some of the most powerful electromagnets, and can be used in magnetic resonance imaging (MRI) machines, nuclear magnetic resonance (NMR) spectrometers, mass spectrometers, particle accelerators, and in plasma confinement in fusion reactors. In particular, superconducting wires comprising filaments formed from niobium-based superconductors, such as niobium tin ($Nb_3Sn$), have attracted interest for use in a variety of electromagnetic applications, such as magnets (e.g., high-field 10-20 T) magnets), motors, and transformers.

SUMMARY

Disclosed herein are superconducting wires. The superconducting wires can comprise a metallic matrix (for example, a Cu-based metal) and at least one continuous subelement embedded in the matrix, Each subelement can comprise a non-superconducting core, a superconducting layer coaxially disposed around the non-superconducting core, and a barrier layer coaxially disposed around the superconducting layer. The superconducting layer can comprise a plurality of $Nb_3Sn$ grains stabilized by metal oxide particulates disposed therein. The $Nb_3Sn$ grains can have an average grain size of from 5 nm to 90 nm (for example from 15 nm to 30 nm). In some examples, the diameter of each subelement can be from 5 µm to 150 µm.

The superconducting layer can, in some examples, further comprise a dopant, for example, to improve the superconducting properties of the superconducting layer. Examples of suitable dopants include, but are not limited to, Ti, Ta, and combinations thereof.

In some cases, the barrier layer can comprise a Nb alloy, a Ta alloy, a Ti alloy, or a combination thereof. In certain cases, the barrier layer comprises a Nb alloy. In some examples, the Nb alloy can comprise an alloy formed from Nb and a metal that has an oxidation potential greater than the oxidation potential of Nb. In some examples, the Nb alloy is selected from the group consisting of a Nb—Zr alloy, a Nb—Al alloy, a Nb—Ti alloy, and combinations thereof.

The metal oxide particulates disposed in the superconducting layer can comprise a metal that has an oxidation potential greater than the oxidation potential of Nb. In some examples, the metal oxide particulates can comprise a metal oxide selected from the group consisting of $ZrO_2$, $Al_2O_3$, $TiO_2$, and combinations thereof.

The superconducting layer (e.g., the $Nb_3Sn$ layer) can, in some examples, have a high-field critical current density ($J_c$ of from 5,000 to 21,000 $A/mm^2$ at a temperature of 4.2 K in a magnetic field of 12 T. In some examples, the superconducting layer (e.g., the $Nb_3Sn$ layer) can exhibit a high-field critical current density ($J_c$) of 9,500 $A/mm^2$ or more at a temperature of 4.2 K in a magnetic field of 12 T. The flux pinning force vs. field ($F_p$-B) curve of the superconducting layer can peak at from 0.2 to 0.5 times the irreversibility field ($B_{irr}$).

Also disclosed herein are superconducting wire precursors. The superconducting wire precursors can be heat treated to prepare superconducting wires, such as those described herein.

In some embodiments, the superconducting wire precursor can comprise a metallic matrix (for example, a Cu-based metal) and at least one continuous subelement precursor embedded in the matrix. Each subelement precursor can comprise, in some examples, a Sn-based metal core, a Cu-based layer coaxially disposed around the Sn-based metal core, a metal oxide layer coaxially disposed around the Cu-based layer, and a Nb alloy layer coaxially disposed around the metal oxide layer.

The Nb alloy layer can, in some examples, comprise an alloy of Nb and a metal that has an oxidation potential greater than the oxidation potential of Nb. In some examples, the Nb alloy layer can comprise a Nb alloy selected from the group consisting of a Nb—Zr alloy, a Nb—Al alloy, Nb—Ti alloy, and combinations thereof.

The metal oxide layer can, for example, comprise a metal oxide that has a lower oxidation potential than $NbO_2$. In some examples, the metal oxide layer comprises a metal oxide comprising a metal selected from the group consisting of Sn, Cu, Zn, Nb, Fe, Ni, Cr, Co, W, and combinations thereof. In some examples, the metal oxide layer comprises a metal oxide selected from the group consisting of $SnO_2$, $CuO$, $ZnO$, $Nb_2O_5$, and combinations thereof.

In some examples, the superconducting wire precursor can comprise a metallic matrix (for example, a Cu-based metal) and at least one continuous subelement precursor embedded in the matrix. Each subelement precursor can comprise a Sn-based metal core, a Cu-based layer coaxially disposed around the Sn-based metal core, a first Nb alloy layer coaxially disposed around the Cu-based layer, a metal oxide layer coaxially disposed around the first Nb alloy layer, and a second Nb alloy layer coaxially disposed around the metal oxide layer.

The first Nb alloy and the second Nb alloy can each comprise an alloy of Nb and a metal that has an oxidation potential greater than the oxidation potential of Nb (e.g., Zr, Al, Ti, Be, etc.). In certain examples, the first Nb alloy and the second Nb alloy can each comprise a Nb alloy selected from the group consisting of a Nb—Zr alloy, a Nb—Al alloy, a Nb—Ti alloy, and combinations thereof. The first Nb alloy and/or the second Nb alloy can each optionally comprise a dopant to be incorporated into the resulting superconducting layer formed from the first Nb alloy and/or the second Nb alloy. Suitable dopants are known in the art, and include, for example, Ti, Ta, and combinations thereof.

The metal oxide layer can, for example, comprise a metal oxide that has a lower oxidation potential than $NbO_2$. In some examples, the metal oxide layer comprises a metal oxide comprising a metal selected from the group consisting of Sn, Cu, Zn, Nb, Fe, Ni, Cr, Co, W, and combinations thereof. In some examples, the metal oxide layer comprises a metal oxide selected from the group consisting of $SnO_2$, CuO, ZnO, $Nb_2O_5$, and combinations thereof.

In some examples, the superconducting wire precursor can comprise a metallic matrix (for example, a Cu-based metal) and at least one continuous subelement precursor embedded in the matrix. Each subelement precursor can comprise a Sn-based metal core, a Cu-based layer coaxially disposed around the Sn-based metal core, a Nb alloy layer coaxially disposed around the Cu-based layer, a metal oxide layer coaxially disposed around the Cu-based layer, and a barrier layer coaxially disposed around the metal oxide layer.

The Nb alloy can comprise an alloy of Nb and a metal that has an oxidation potential greater than the oxidation potential of Nb (e.g., Zr, Al, Ti, Be, etc.). In certain examples, the Nb alloy layer can comprise a Nb alloy selected from the group consisting of a Nb—Zr alloy, a Nb—Al alloy, Nb—Ti alloy, and combinations thereof. The Nb alloy can further comprise a dopant to be incorporated into the resulting superconducting layer formed from the Nb alloy. Suitable dopants are known in the art, and include, for example, Ti, Ta, and combinations thereof.

The metal oxide layer can, for example, comprise a metal oxide that has a lower oxidation potential than $NbO_2$. In some examples, the metal oxide layer comprises a metal oxide comprising a metal selected from the group consisting of Sn, Cu, Zn, Nb, Fe, Ni, Cr, Co, W, and combinations thereof. In some examples, the metal oxide layer comprises a metal oxide selected from the group consisting of $SnO_2$, CuO, ZnO, $Nb_2O_5$, and combinations thereof.

The barrier layer can comprise any suitable material that can inhibit diffusion of the superconducting layer into the metallic matrix. For example, the barrier layer can comprise Nb metal or an alloy thereof, Ta metal or an alloy thereof, Ti metal or an alloy thereof, Mo metal or an alloy thereof, or a combination thereof. In some embodiments, the barrier layer can comprise Nb metal or an alloy thereof. In certain embodiments, the barrier layer can comprise a Nb alloy. Examples of suitable Nb alloys include, but are not limited to, Nb—Zr alloys, Nb—Al alloys, Nb—Ti alloys, Nb—Ta alloys, Nb—Be alloys, Nb—Ni alloys, Nb—Fe alloys, Nb—Sn alloys, and combinations thereof. In some examples, the Nb alloy can be selected from the group consisting of a Nb—Zr alloy, a Nb—Al alloy, a Nb—Ti alloy, and combinations thereof.

In some embodiments, the superconducting wire precursor can comprise a metallic matrix (for example, a Cu-based metal) and at least one continuous subelement precursor embedded in the matrix, wherein each subelement precursor can comprise a core comprising a blend of a Sn-containing powder and a metal oxide powder; and a Nb alloy layer coaxially disposed around the core.

The Sn-containing powder can, for example, comprise Sn powder, $NbSn_2$ powder, $Nb_6Sn_5$ powder, or a combination thereof. In certain embodiments, the Sn-containing powder can further comprise Cu powder.

The Nb alloy layer can, in some examples, comprise an alloy of Nb and a metal that has an oxidation potential greater than the oxidation potential of Nb. In some examples, the Nb alloy layer can comprise a Nb alloy selected from the group consisting of a Nb—Zr alloy, a Nb—Al alloy, a Nb—Ti alloy, and combinations thereof.

The metal oxide powder can comprise a metal oxide that has a lower oxidation potential than $NbO_2$. In some examples, the metal oxide powder comprises a metal oxide comprising a metal selected from the group consisting of Sn, Cu, Zn, Nb, Fe, Ni, Cr, Co, W, and combinations thereof. In some examples, the metal oxide powder comprises a metal oxide selected from the group consisting of $SnO_2$, CuO, ZnO, $Nb_2O_5$, and combinations thereof.

In some embodiments, the superconducting wire precursor can comprise a metallic matrix (for example, a Cu-based metal) and at least one continuous subelement precursor embedded in the matrix, wherein each subelement precursor can comprise a Sn-based metal core; a Cu-based layer coaxially disposed around the Sn-based metal core; a Nb alloy layer coaxially disposed around the Cu-based layer, the Nb alloy layer further comprising a plurality of metal oxide regions disposed within the Nb alloy layer; and a barrier layer coaxially disposed around the Nb alloy layer.

The Nb alloy layer can, in some examples, comprise an alloy of Nb and a metal that has an oxidation potential greater than the oxidation potential of Nb. In some examples, the Nb alloy layer can comprise a Nb alloy selected from the group consisting of a Nb—Zr alloy, a Nb—Al alloy, a Nb—Ti alloy, and combinations thereof.

In some cases, the barrier layer can comprise a Nb alloy, a Ta alloy, a Ti alloy, or a combination thereof. In certain cases, the barrier layer comprises a Nb alloy. In some examples, the Nb alloy can comprise an alloy formed from Nb and a metal that has an oxidation potential greater than the oxidation potential of Nb. In some examples, the Nb alloy is selected from the group consisting of a Nb—Zr alloy, a Nb—Al alloy, a Nb—Ti alloy, and combinations thereof.

The plurality of metal oxide regions can, in some examples, each comprise a metal oxide that has a lower oxidation potential than $NbO_2$. In some examples, the plurality of metal oxide regions each comprise a metal oxide comprising a metal selected from the group consisting of Sn, Cu, Zn, Nb, Fe, Ni, Cr, Co, W, and combinations thereof. In some examples, the plurality of metal oxide regions each comprise a metal oxide selected from the group consisting of $SnO_2$, CuO, ZnO, $Nb_2O_5$, and combinations thereof.

In some embodiments, the Nb alloy layer can comprise a plurality of discrete Nb alloy rods which in combination make up the Nb alloy layer. Each Nb alloy rod can comprise a Nb alloy core ensheathed in copper or a copper alloy. In these cases, the Nb alloy rods can be formed into hexed cross sectioned rods to facilitate hexagonal packing of the Nb alloy rods. In some embodiments, the plurality of metal oxide regions can comprise a plurality of metal oxide rods. Each metal oxide rod can comprise a metal oxide core (e.g., a metal oxide powder) ensheathed in copper or a copper alloy. In certain cases, the metal oxide rods can also be formed into hexed cross sectioned rods to enable their packing among the hexagonally packed Nb alloy rods.

Also disclosed herein are methods of making superconducting wires. In some examples, the method can comprise heat treating any of the superconducting wire precursors described herein to form a superconducting wire comprising a superconducting phase comprising $Nb_3Sn$.

Heat treating the superconducting wire precursor can, for example, comprise heating the superconducting wire precursor at a temperature of at least 600° C. In some examples, heat treating the superconducting wire precursor comprises heating the superconducting wire precursor at a temperature of from 600° C. to 850° C.

Heat treating the superconducting wire precursor can, for example, comprise heating the superconducting wire precursor for at least 10 minutes. In some examples, heat treating the superconducting wire precursor comprises heating the superconducting wire precursor for from 10 minutes to 800 hours.

DETAILED DESCRIPTION

The materials, methods and devices described herein may be understood more readily by reference to the following detailed description of specific aspects of the disclosed subject matter, figures and the examples included therein.

Before the present materials, devices and methods are disclosed and described, it is to be understood that the aspects described below are not intended to be limited in scope by the specific devices and methods described herein, which are intended as illustrations. Various modifications of the materials, devices and methods in addition to those shown and described herein are intended to fall within the scope of that described herein. Further, while only certain representative materials, devices and method steps disclosed herein are specifically described, other combinations of the materials, devices and method steps also are intended to fall within the scope of that described herein, even if not specifically recited. Thus, a combination of steps, elements, components, or constituents may be explicitly mentioned herein, however, other combinations of steps, elements, components, and constituents are included, even though not explicitly stated. In should also be noted that reference is made herein to 'layers' of particular composition within the superconducting wires and superconducting wire precursors described herein. It should be noted that 'layers' formed from a particular material (e.g., a particular alloy) can be formed from an integral piece of the particular material (e.g., the particular alloy), or from a plurality of pieces of the particular material (e.g., the particular alloy) that together combine to form the layer.

Superconducting Wires

Disclosed herein are superconducting wires. The superconducting wires can comprise a metallic matrix and at least one continuous subelement (also referred to as a filament) embedded in the matrix.

The metallic matrix can comprise any suitable metal or combination of metals. The metallic matrix can be formed from a metal or combination of metals that is electrically conductive at temperatures below 77 K. Preferably, the metal or combination of metals forming the metallic matrix can exhibit a coefficient of thermal expansion that is substantially the same or greater than the coefficient of thermal expansion of $Nb_3Sn$. For example, the metallic matrix can comprise a Cu-based metal (e.g., copper or an alloy thereof).

The superconducting wires can include any number of subelements, as known in the art, to prepare a suitable superconducting wire for a particular application. In some embodiments, the superconducting wire can comprise a single subelement. In other embodiments, the superconducting wire can comprise a plurality of subelements. For example, the superconducting wire can comprise from 1 to 25,000 subelements (e.g., from 1 to 61 filaments, from 1 to 244 filaments, from to 366 filaments, from to 1,000 filaments, from 1 to 2,500 filaments, from 1 to 5,000 filaments, from 1 to 15,000 filaments, or from 10,000 to 25,000 filaments).

Each subelement can comprise a non-superconducting core, a superconducting layer coaxially disposed around the non-superconducting core, and a barrier layer coaxially disposed around the superconducting layer.

The non-superconducting core can comprise any suitable non-superconducting material. In some examples, the non-superconducting core can comprise a Sn-based metal (e.g., Sn metal or an alloy thereof). In certain embodiments, the non-superconducting core can comprise a Sn—Cu alloy. In some examples, the non-superconducting core can comprise a hollow core.

The superconducting layer coaxially disposed around the non-superconducting core can comprise a Nb-based superconductor, such as $Nb_3Sn$. The superconducting layer can comprise a plurality of $Nb_3Sn$ grains stabilized by metal oxide particulates disposed therein (e.g., dispersed throughout the superconducting layer).

The $Nb_3Sn$ grains can have a fine grained microstructure (e.g., an average grain size of from 5 nm to 90 nm). The metal oxide particulates can serve to stabilize the fine grained microstructure of the $Nb_3Sn$ at elevated temperatures at which the $Nb_3Sn$ is formed (e.g., from 600° C. to 850° C.) and inhibit $Nb_3Sn$ grain growth, thus allowing $Nb_3Sn$ to maintain its fine grained microstructure when heat treated.

The average grain size of the plurality of $Nb_3Sn$ grains in the superconducting layer can be determined using standard methods known in the art, such scanning electron microscopy (SEM). In some examples, the plurality of $Nb_3Sn$ grains can have an average grain size of 5 nm or more (e.g., 10 nm or more, 15 nm or more, 20 nm or more, 25 nm or more, 30 nm or more, 35 nm or more, 40 nm or more, 45 nut or more, 50 nm or more, 55 nm or more, 60 nm or more, 65 nm or more, 70 nm or more, 75 nm or more, 80 nm or more, or 85 nm or more). In some examples, the plurality of $Nb_3Sn$ grains can have an average grain size of 90 nm or less (e.g., 85 nm or less, 80 nm or less, 75 nm or less, 70 nm or less, 65 nm or less, 60 nm or less, 55 nm or less, 50 nm or less, 45 nm or less, 40 nm or less, 35 nm or less, 30 nm or less, 25 nm or less, 20 nm or less, 15 nm or less, or 10 nm or less).

The average grain size of the plurality of $Nb_3Sn$ grains can range from any of the minimum values described above to any of the maximum values described above, for example from 5 nm to 90 nm (e.g., from 15 nm to 90 nm, from 5 nm to 50 nm, from 15 nm to 50 nm, from 50 nm to 90 nm, from 5 urn to 30 nm, from 15 nut to 30 nm, from 5 nm to 45 nm, from 15 nm to 45 nm, from 30 nm to 45 nm, from 45 nm to 60 nm, from 60 nm, to 75 nm, or from 75 nm to 90 nm).

In some examples, the superconducting layer can further comprise a dopant. Dopants can be incorporated into the superconducting layer to improve the superconducting properties of the superconducting layer. Suitable dopants are known in the art, and include, for example, and combinations thereof.

The metal oxide particulates disposed in the superconducting layer can comprise a metal that has an oxidation potential greater than the oxidation potential of Nb. In some examples, the metal oxide particulates disposed in the superconducting layer can comprise a metal that is less noble than Nb (e.g., a metal that appears lower than Nb in a galvanic series). In some examples, the metal oxide particulates can comprise a metal oxide selected from the group consisting of $ZrO_2$, $Al_2O_3$, $TiO_2$, and combinations thereof. In one embodiment, the superconducting layer can be substantially free of $ZrO_2$ particulates.

The barrier layer can comprise any suitable material that can inhibit diffusion of the superconducting layer into the metallic matrix. For example, the barrier layer can comprise Nb metal or an alloy thereof, Ta metal or an alloy thereof, Ti metal or an alloy thereof, Mo metal or an alloy thereof, or a combination thereof. In some embodiments, the barrier layer can comprise Nb metal or an alloy thereof. In certain embodiments, the barrier layer can comprise a Nb alloy. In some examples, the Nb alloy can comprise an alloy formed from Nb and a metal that has an oxidation potential greater than the oxidation potential of Nb. In some examples, the Nb alloy can comprise an alloy firmed from Nb and a metal that is less noble than Nb (e.g., a metal that appears lower than Nb in a galvanic series). Examples of suitable Nb alloys include, but are not limited to, Nb—Zr alloys, Nb—Al alloys, Nb—Ti alloys, Nb—Ta alloys, Nb—Be alloys, Nb—Ni alloys, Nb—Fe alloys, Nb—Sn alloys, and combinations thereof. In some examples, the Nb alloy can be selected from the group consisting of a Nb—Zr alloy, a Nb—Al alloy, a Nb—Ti alloy, and combinations thereof.

The superconducting layer (e.g., the $Nb_3Sn$ phase) can exhibit improved properties (e.g., an improved high-field critical current density ($J_c$)) relative to existing niobium-tin superconductors. The superconducting wire comprising the superconducting layer can therefore also exhibit improved properties relative to existing niobium-tin superconducting wires. For example, in some embodiments, the superconducting layer (e.g., the $Nb_3Sn$ layer) can have a high-field critical current density of 5,000 $A/mm^2$ or more (e.g., 5,500 $A/mm^2$ or more; 6,000 $A/mm^2$ or more; 6,500 $A/mm^2$ or more; 7,000 $A/mm^2$ or more; 7,500 $A/mm^2$ or more; 8,000 $A/mm^2$ or more; 8,500 $A/mm^2$ or more; 9,000 $A/mm^2$ or more; 9,500 $A/mm^2$ or more; 10,000 $A/mm^2$ or more; 11,000 $A/mm^2$ or more; 12,000 $A/mm^2$ or more; 13,000 $A/mm^2$ or more; 14,000 $A/mm^2$ or more; 15,000 $A/mm^2$ or more; 16,000 $A/mm^2$ or more; 17,000 $A/mm^2$ or more; 18,000 $A/mm^2$ or more; 19,000 $A/mm^2$ or more; or 20,000 $A/mm^2$ or more) at a temperature of 4.2 K in a magnetic field of 12 T. In some embodiments, the superconducting layer (e.g., the $Nb_3Sn$ layer) can have a critical current density of 21,000 $A/mm^2$ or less (e.g., 20,000 $A/mm^2$ or less; 19,000 $A/mm^2$ or less; 18,000 $A/mm^2$ or less; 17,000 $A/mm^2$ or less; 16,000 $A/mm^2$ or less; 15,000 $A/mm^2$ or less; 14,000 $A/mm^2$ or less; 13,000 $A/mm^2$ or less; 12,000 $A/mm^2$ or less; 11,000 $A/mm^2$ or less; 10,000 $A/mm^2$ or less; 9,500 $A/mm^2$ or less; 9,000 $A/mm^2$ or less; 8,500 $A/mm^2$ or less; 8,000 $A/mm^2$ or less; 7,500 $A/mm^2$ or less; 7,000 $A/mm^2$ or less; 6,500 $A/mm^2$ or less; 6,000 $A/mm^2$ or less; or 5,500 $A/mm^2$ or less) at a temperature of 4.2 K in a magnetic field of 12 T.

The superconducting layer can have a high-field critical current density at a temperature of 4.2 K in a magnetic field of 12 T ranging from any of the minimum values described above to any of the maximum values described above. For example, the superconducting layer (e.g., the layer) can have a high-field critical current density at a temperature of 4.2 K in a magnetic field of 12 T of from 5,000 $A/mm^2$ to 21,000 $A/mm^2$ (e.g., from 5,000 $A/mm^2$ to 13,000 $A/mm^2$; from 13,000 $A/mm^2$ to 21,000 $A/mm^2$; from 5,000 $A/mm^2$ to 9,000 $A/mm^2$; from 9,000 $A/mm^2$ to 13,000 $A/mm^2$; from 9,500 $A/mm^2$ to 13,000 $A/mm^2$; from 13,000 $A/mm^2$ to 17,000 $A/mm^2$; from 17,000 $A/mm^2$ to 21,000 $A/mm^2$, or from 9,500 $A/mm^2$ to 21,000 $A/mm^2$).

In some embodiments, the flux pinning force vs. field ($F_p$-B) curve of the superconducting layer can peak at 0.2 times the irreversibility field ($B_{irr}$) or more (e.g., 0.22 $B_{irr}$ or more, 0.24 $B_{irr}$ or more, 0.26 $B_{irr}$ or more, 0.28 $B_{irr}$ or more, 0.3 $B_{irr}$ or more, 0.32 $B_{irr}$ or more, 0.34 $B_{irr}$ or more, 0.36 $B_{irr}$ or more, 0.38 $B_{irr}$ or more, 0.4 $B_{irr}$ or more, 0.42 $B_{irr}$ or more, 0.44 $B_{irr}$ or more, 0.46 $B_{irr}$ or more, or 0.48 $B_{irr}$ or more). In some examples, the flux pinning force vs. field ($F_p$-B) curve of the superconducting layer can peak at 0.5 times the irreversibility field ($B_{irr}$) or less (e.g., 0.48 $B_{irr}$ or less, 0.46 $B_{irr}$ or less, 0.44 $B_{irr}$ or less, 0.42 $B_{irr}$ or less, 0.4 $B_{irr}$ or less, 0.38 $B_{irr}$ or less, 0.36 $B_{irr}$ or less, 0.34 $B_{irr}$ or less, 0.32 $B_{irr}$ or less, 0.3 $B_{irr}$ or less, 0.28 $B_{irr}$ or less, 0.26 $B_{irr}$ or less, 0.24 $B_{irr}$ or less, or 0.22 $B_{irr}$ or less).

The peak of the flux pinning force vs. field ($F_p$-B) curve of the superconducting layer can range from any of the minimum values described above to any of the maximum values described above. For example, the flux pinning force vs. field ($F_p$-B) curve of the superconducting layer can peak at from 0.2 $B_{irr}$ to 0.5 $B_{irr}$ (e.g., from 0.2 $B_{irr}$ to 0.36 $B_{irr}$ from 0.36 $B_{irr}$ to 0.5 $B_{irr}$ from 0.2 $B_{irr}$ to 0.3 $B_{irr}$ from 0.3 $B_{irr}$ to 0.4 $B_{irr}$ from 0.4 $B_{irr}$ to 0.5 $B_{irr}$ or from 0.3 $B_{irr}$ to 0.5 $B_{irr}$).

The diameter of each subelement in the superconducting wire can be, for example, from 5 μm to 150 μm. In some examples, the diameter of each subelement in the superconducting wire can be 5 μm or more (e.g., 10 μm or more, 20 μm or more, 30 μm or more, 40 μm or more, 50 μm or more, 60 μm or more, 70 μm or more, 80 μm or more, 90 μm or more, 100 μm or more, 110 μm or more, 120 μm or more, 130 μm or more, or 140 μm or more). In some examples, the diameter of each subelement in the superconducting wire can be 150 μm or less (e.g., 140 μm or less, 130 μm or less, 120 μm or less, 110 μm or less, 100 μm or less, 90 μm or less, 80 μm or less, 70 μm or less, 60 μm or less, 50 μm or less, 40 μm or less, 30 μm or less, 20 μm or less, 10 μm or less).

The diameter of each subelement in the superconducting wire can range from any of the minimum values described above to any of the maximum values described above, for example from 5 μm to 150 μm (e.g., from 5 μm to 80 μm from 80 μm to 150 μm, from 5 μm to 30 μm, from 30 μm to 60 μm, from 60 μm to 90 μm, from 90 μm to 120 μm, from 120 μm to 150 μm, or from 10 μm to 100 μm). In other embodiments, the diameter of each subelement in the superconducting wire can be, for example, from 150 μm to 500 μm.

Superconducting Wire Precursors

Also disclosed herein are superconducting wire precursors. The superconducting wire precursors can be heat treated to prepare superconducting wires, such as those described herein.

Tube-Type Superconducting Wire Precursors

Figure 1:
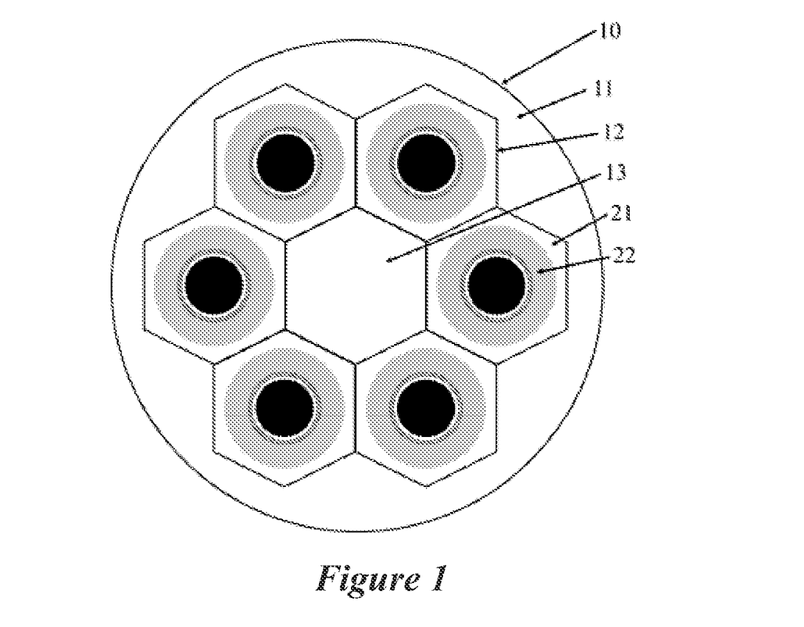
FIG. 1 illustrates a schematic cross section of a wire with modified "tube type" subelements (before heat treatment) to realize internal oxidation.

Referring now to FIG. 1, tube-type superconducting wire precursors (10) can comprise a metallic matrix (for example, a Cu-based metal) (11); and at least one continuous subelement precursor (12) embedded in the matrix.

As described above with respect to the superconducting wires, the metallic matrix can comprise any suitable metal or combination of metals. The metallic matrix can be formed from a metal or combination of metals that is electrically conductive at temperatures below 77 K. Preferably, the metal or combination of metals forming the metallic matrix can exhibit a coefficient of thermal expansion that is substantially the same or greater than the coefficient of thermal expansion of $Nb_3Sn$. For example, the metallic matrix can comprise a Cu-based metal (e.g., copper or an alloy thereof).

Figure 2:
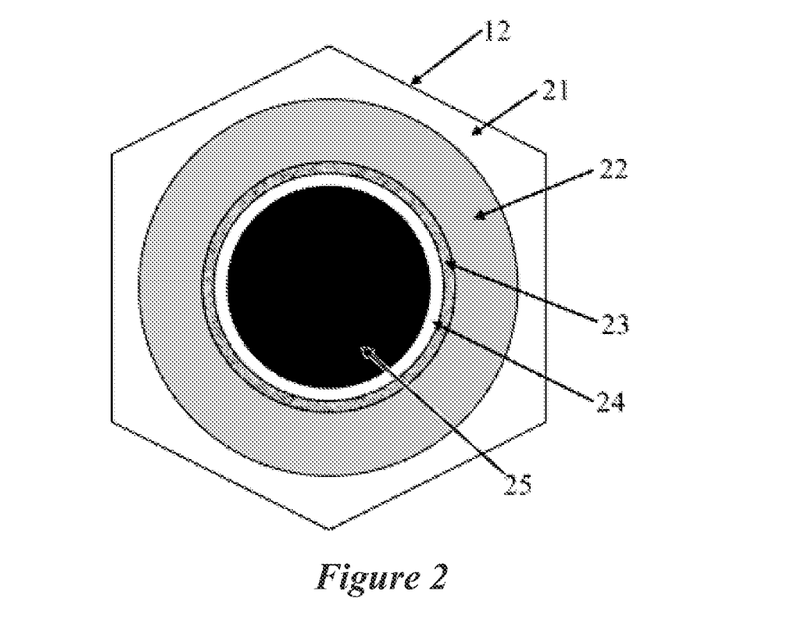
FIG. 2 illustrates a schematic cross section of a modified "tube type" subelement used in the wire shown in FIG. 1 (before heat treatment) to realize internal oxidation.

Referring now to FIG. 2, each subelement precursor (12) can comprise a Sn-based metal core (25) (e.g., a Sn metal rod), a Cu-based layer (24) coaxially disposed around the Sn-based metal core; a metal oxide layer (23) coaxially disposed around the Cu-based layer; and a Nb alloy layer (22) coaxially disposed around the metal oxide layer, Each subelement precursor (12) can further include a metallic matrix (21) disposed about the Nb alloy layer.

The composition of the metal oxide and the Nb alloy can be selected in combination so as to facilitate internal oxidation of the Nb alloy upon heat treatment of the superconducting wire precursor. Upon heat treatment of the superconducting wire precursor, Sn from the core can diffuse to the Nb alloy layer, forming a superconducting $Nb_3Sn$ layer. The composition of the metal oxide layer and the Nb alloy layer can be selected to provide for the formation of metal oxide particulates disposed within superconducting $Nb_3Sn$ layer upon heat treatment of the superconducting wire precursor. As described above, the metal oxide particulates can serve to control the grain size of the $Nb_3Sn$ formed during heat treatment, thereby forming a niobium-tin superconducting phase comprising $Nb_3Sn$ grains having a refined average grain size (e.g., from 5 nm to 30 nm).

For example, the Nb alloy layer can comprise an alloy of Nb and a metal that has an oxidation potential greater than the oxidation potential of Nb (e.g., Zr, Al, Ti, Be, etc.). In some examples, the Nb alloy layer can comprise an alloy of Nb and a metal that has a higher affinity for oxygen than Nb. In certain examples, the Nb alloy layer can comprise a Nb alloy selected from the group consisting of a Nb—Zr alloy, a Nb—Al alloy, a Nb—Ti alloy, and combinations thereof. The Nb alloy can further comprise a dopant to be incorporated into the resulting superconducting layer funned from the Nb alloy. Suitable dopants are known in the art, and include, for example, Ti, Ta, and combinations thereof.

The metal oxide layer can, for example, comprise a metal oxide that has a lower oxidation potential than $NbO_2$. In some examples, the metal oxide layer can comprise a metal oxide that can supply oxygen to Nb. In some examples, the metal oxide layer comprises a metal oxide comprising a metal selected from the group consisting of Sn, Cu, Zn, Nb, Fe, Ni, Cr, Co, W, and combinations thereof. In some examples, the metal oxide layer comprises a metal oxide selected from the group consisting of $SnO_2$, CuO, ZnO, $Nb_2O_5$, and combinations thereof.

Figure 7:
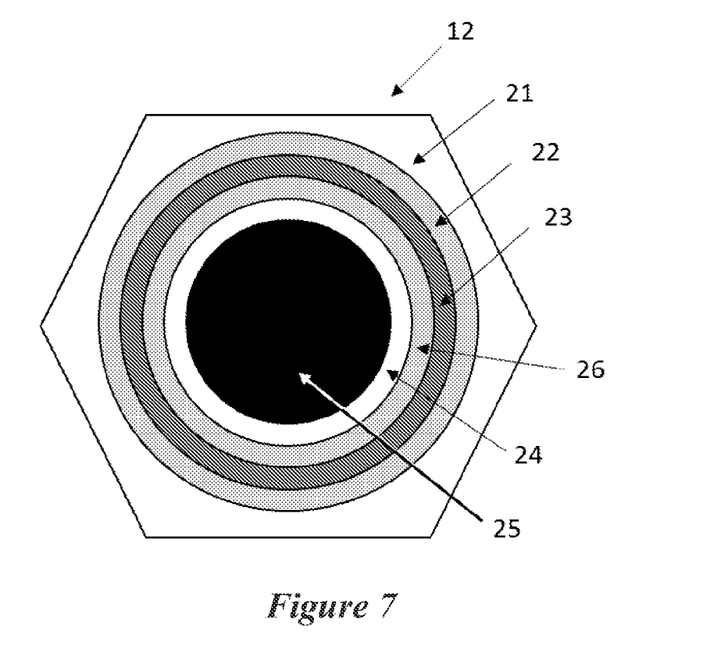
FIG. 7 illustrates a schematic cross section of a modified "tube type" subelement (before heat treatment) used to realize internal oxidation.

Referring now to FIG. 7, in some examples the tube-type subelement precursor (12) can comprise a Sn-based metal core (25) (e.g., a Sn metal rod), a Cu-based layer (24) coaxially disposed around the Sn-based metal core, a first Nb alloy layer (26) coaxially disposed around the Cu-based layer, a metal oxide layer (23) coaxially disposed around the first Nb alloy layer, and a second Nb alloy layer (22) coaxially disposed around the metal oxide layer. Each subelement precursor (12) can further include a metallic matrix (21) disposed about the second Nb alloy layer.

The first Nb alloy and the second Nb alloy can each comprise an alloy of Nb and a metal that has an oxidation potential greater than the oxidation potential of Nb (e.g., Zr, Al, Ti, Be, etc.). In some examples, the first Nb alloy layer and the second Nb alloy can each comprise an alloy of Nb and a metal that has a higher affinity for oxygen than Nb. In certain examples, the first Nb alloy and the second Nb alloy can each comprise a Nb alloy selected from the group consisting of a Nb—Zr alloy, a Nb—Al alloy, a Nb—Ti alloy, and combinations thereof. The first Nb alloy and/or the second Nb alloy can each optionally comprise a dopant to be incorporated into the resulting superconducting layer formed from the first Nb alloy and/or the second Nb alloy. Suitable dopants are known in the art, and include, for example, Ti, Ta, and combinations thereof.

The metal oxide layer can, for example, comprise a metal oxide that has a lower oxidation potential than $NbO_2$. In some examples, the metal oxide layer can comprise a metal oxide that can supply oxygen to Nb. In some examples, the metal oxide layer comprises a metal oxide comprising a metal selected from the group consisting of Sn, Cu, Zn, Nb, Fe, Ni, Cr, Co, W, and combinations thereof. In some examples, the metal oxide layer comprises a metal oxide selected from the group consisting of $SnO_2$, CuO, ZnO, $Nb_2O_5$, and combinations thereof.

Figure 8:
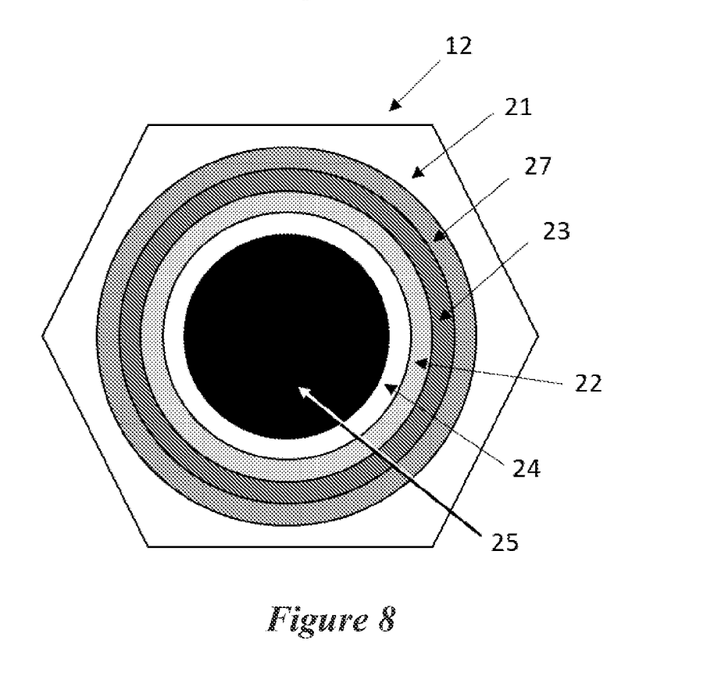
FIG. 8 illustrates a schematic cross section of a modified "tube type" subelement (before heat treatment) used to realize internal oxidation.

Referring now to FIG. 8, in some examples the tithe-type subelement precursor (12) can comprise a Sn-based metal core (25) (e.g., a Sn metal rod), a Cu-based layer (24) coaxially disposed around the Sn-based metal core, a Nb alloy layer (22) coaxially disposed around the Cu-based layer, a metal oxide layer (23) coaxially disposed around the Cu-based layer, and a barrier layer (27) coaxially disposed around the metal oxide layer. Each subelement precursor (12) can further include a metallic matrix (21) disposed about the barrier layer.

The Nb alloy can comprise an alloy of Nb and a metal that has an oxidation potential greater than the oxidation potential of Nb (e.g., Zr, Al, Ti, Be, etc.). In some examples, the Nb alloy layer can comprise an alloy of Nb and a metal that has a higher affinity for oxygen than Nb. In certain examples, the Nb alloy layer can comprise a Nb alloy selected from the group consisting of a Nb—Zr alloy, a Nb—Al alloy, a Nb—Ti alloy, and combinations thereof. The Nb alloy can further comprise a dopant to be incorporated into a resulting superconducting layer formed from the Nb alloy. Suitable dopants are known in the art, and include, for example, Ti, Ta, and combinations thereof.

The metal oxide layer can, for example, comprise a metal oxide that has a lower oxidation potential than $NbO_2$. In some examples, the metal oxide layer can comprise a metal oxide that can supply oxygen to Nb. In some examples, the metal oxide layer comprises a metal oxide comprising a metal selected from the group consisting of Sn, Cu, Zn, Nb, Fe, Ni, Cr, Co, W, and combinations thereof. In some examples, the metal oxide layer comprises a metal oxide selected from the group consisting of $SnO_2$, CuO, ZnO, $Nb_2O_5$, and combinations thereof.

The barrier layer can comprise any suitable material that can inhibit diffusion of the superconducting layer into the metallic matrix. For example, the barrier layer can comprise Nb metal or an alloy thereof, Ta metal or an alloy thereof, Ti metal or an alloy thereof, Mo metal or an alloy thereof, or a combination thereof. In some embodiments, the barrier layer can comprise Nb metal or an alloy thereof. In certain embodiments, the barrier layer can comprise a Nb in some examples, the Nb alloy can comprise an alloy formed from Nb and a metal that has an oxidation potential greater than the oxidation potential of Nb. In some examples, the Nb alloy can comprise an alloy formed from Nb and a metal that is less noble than Nb (e.g., a metal that appears lower than Nb in a galvanic series). Examples of suitable Nb alloys include, but are not limited to, Nb—Zr alloys, Nb—Al alloys, Nb—Ti alloys, Nb—Ta alloys, Nb—Be alloys, Nb—Ni Nb—Fe alloys, Nb—Sn alloys, and combinations thereof. In some examples, the Nb alloy can be selected from the group consisting of a Nb—Zr alloy, a Nb—Al alloy, a Nb—Ti alloy, and combinations thereof.

Precursors of this type can be fabricated using standard methods known in the art for fabricating tube-type superconducting strands. The metal oxide layers in the precursors above can be introduced into the tube-type superconducting wire precursor preforms by positioning a metal oxide powder at an appropriate position between two layers of the tube-type superconducting wire precursor preform. By way of example, in the case of the subelement precursor illustrated in FIG. 2, the metal oxide layer can be introduced into the tube-type superconducting wire precursor preforms by positioning a metal oxide powder between the outer surface of the Cu-based tube forming the Cu-based layer and the inner surface of the Nb alloy tube forming the Nb alloy layer. The metal oxide layers in the precursors above can also be introduced into the tube-type superconducting wire precursor preforms by applying a metal oxide coating to an appropriate surface of the tube-type superconducting wire precursor preform. Again by way of example, in the case of the subelement precursor illustrated in FIG. 2, the metal oxide layer can be introduced into the tube-type superconducting wire precursor preforms by applying a metal oxide coating to the outer surface of the Cu-based tube forming the Cu-based layer, the inner surface of the Nb alloy tube forming the Nb alloy layer, or a combination thereof. In these cases, the metal oxide coating can be applied using any suitable method, such as spraying, dip coating, vapor coating, or electrolytic coating.

Once formed, the preforms can be formed into a wire by first extruding the preform, followed by either wire-drawing or swaging the extruded preform. Once drawn or swaged, the preform can be re-stacked by repeating the extrusion step, followed by the drawing or swaging steps, to achieve the desired wire diameter. The re-stacking step can be repeated as many times as necessary until the desired wire diameter is obtained.

Powder-in-Tube Type Superconducting Wire Precursors

Figure 4:
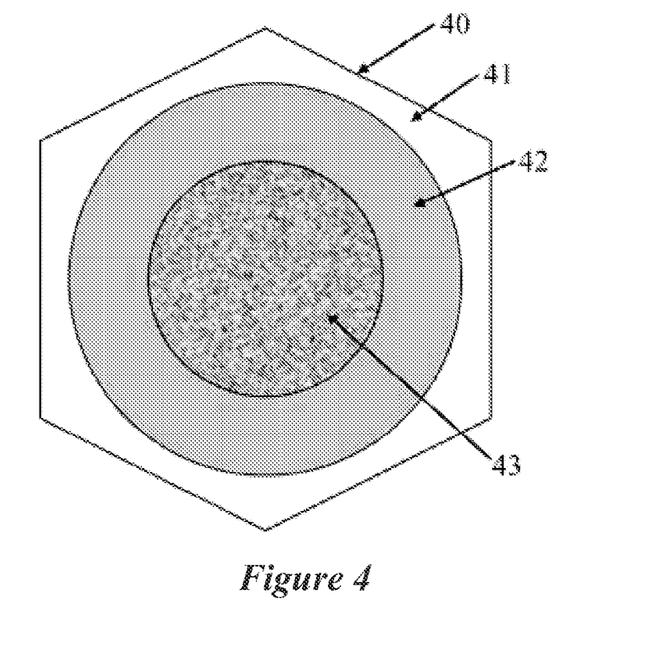
FIG. 4 illustrates a schematic cross section of a modified "powder-in-tube" subelement (before heat treatment) to realize internal oxidation.

Referring now to FIG. 4, powder-in-tube type superconducting wire precursors can comprise a metallic matrix (for example, a Cu-based metal), and at least one continuous subelement precursor (40) embedded in the matrix. Each subelement precursor can, for example, comprise a core (43) comprising a blend of a Sn-containing powder and a metal oxide powder, and a Nb alloy layer (42) coaxially disposed around the core. Each subelement precursor (40) can further include a metallic matrix (41) disposed about the Nb alloy layer.

As described above with respect to tube-type superconducting wire precursors, the composition of the metal oxide powder and the Nb alloy can be selected in combination so as to facilitate internal oxidation of the Nb alloy upon heat treatment of the superconducting wire precursor, Upon heat treatment of the superconducting wire precursor, Sn from the Sn-containing powder present in the core can diffuse to the Nb alloy layer, forming the superconducting Nb$_3$Sn layer. The composition of the metal oxide powder and the Nb alloy layer can be selected to provide for the formation of metal oxide particulates disposed within superconducting Nb$_3$Sn layer upon heat treatment of the superconducting wire precursor. As described above, the metal oxide particulates can serve to control the grain size of the Nb$_3$Sn formed during heat treatment, thereby forming a niobium-tin superconducting phase comprising Nb$_3$Sn grains having a refined average grain size (e.g., from 5 nm to 30 nm).

For example, the Nb alloy layer can comprise an alloy of Nb and a metal that has an oxidation potential greater than the oxidation potential of Nb (e.g., Zr, Ti, Be, etc.). In some examples, the Nb alloy can comprise an alloy of Nb and a metal that is less noble than Nb (e.g., a metal that appears lower than Nb in a galvanic series). In certain examples, the Nb alloy layer can comprise a Nb alloy selected from the group consisting of a Nb—Zr alloy, a Nb—Al alloy, a Nb—Ti alloy, and combinations thereof. The Nb alloy can further comprise a dopant to be incorporated into the resulting superconducting layer formed from the Nb alloy. Suitable dopants are known in the art, and include, for example, Ti, Ta, and combinations thereof.

The core can comprise a homogeneous blend of a Sn-containing powder and a metal oxide powder. The metal oxide powder can, for example, comprise a metal oxide that has a lower oxidation potential than NbO$_2$. In some examples, the metal oxide powder can comprise a metal oxide that can supply oxygen to Nb. In some examples, the metal oxide powder comprises a metal oxide comprising a metal selected from the group consisting of Sn, Cu, Zn, Nb, Fe, Ni, Cr, Co, W, and combinations thereof. In some examples, the metal oxide powder comprises a metal oxide selected from the group consisting of SnO$_2$, CuO, ZnO, Nb$_2$O$_5$, and combinations thereof.

The Sn-containing powder can, for example, comprise Sn powder, NbSn$_2$ powder, Nb$_6$Sn$_5$ powder, or a combination thereof. In certain embodiments, the Sn-containing powder can further comprise Cu powder. The addition of Cu to the powder core can have a catalytic effect for the formation of Nb$_3$Sn, and can reduce the reaction temperature necessary to form the superconducting phase upon heat treatment. In some embodiments, the Sn powder can comprise from greater than 0 wt, % to 10 wt. % Cu powder, based on the total weight of all of the components in the powder core.

Precursors of this type can be fabricated using standard methods known in the art for fabricating powder-in-tube type superconducting strands, Once formed, the preforms can be formed into a wire by first extruding the preform, followed by either wire-drawing or swaging the extruded preform. Once drawn or swaged, the preform can be re-stacked by repeating the extrusion step, followed by the drawing or swaging steps, to achieve the desired wire diameter. The re-stacking step can be repeated as many times as necessary until the desired wire diameter is obtained.

Rod-Restack-Process Type Superconducting Wire Precursors

Also disclosed herein are rod-restack-process type superconducting wire precursors. The precursors can comprise a metallic matrix (for example, a Cu-based metal), and at least one continuous subelement precursor embedded in the matrix. Each subelement precursor can, for example, comprise a Sn-based metal core; a Cu-based layer coaxially disposed around the Sn-based metal core; a Nb alloy layer coaxially disposed around the Cu-based layer, the Nb alloy layer further comprising a plurality of metal oxide regions disposed within the Nb alloy layer; and a barrier layer coaxially disposed around the Nb alloy layer. Each subelement precursor can further include a metallic matrix disposed about the barrier layer.

In some embodiments, the Nb alloy layer can comprise a plurality of discrete Nb alloy rods which in combination make up the Nb alloy layer. Each Nb alloy rod can comprise a Nb alloy core ensheathed in copper or a copper alloy. In these cases, the Nb alloy rods can be formed into hexed cross sectioned rods to facilitate hexagonal packing of the Nb alloy rods. In some embodiments, the plurality of metal oxide regions can comprise a plurality of metal oxide rods. Each metal oxide rod can comprise a metal oxide core (e.g., a metal oxide powder) ensheathed in copper or a copper alloy. In certain cases, the metal oxide rods can also be formed into hexed cross sectioned rods to enable their packing among the hexagonally packed Nb alloy rods.

Figure 5:
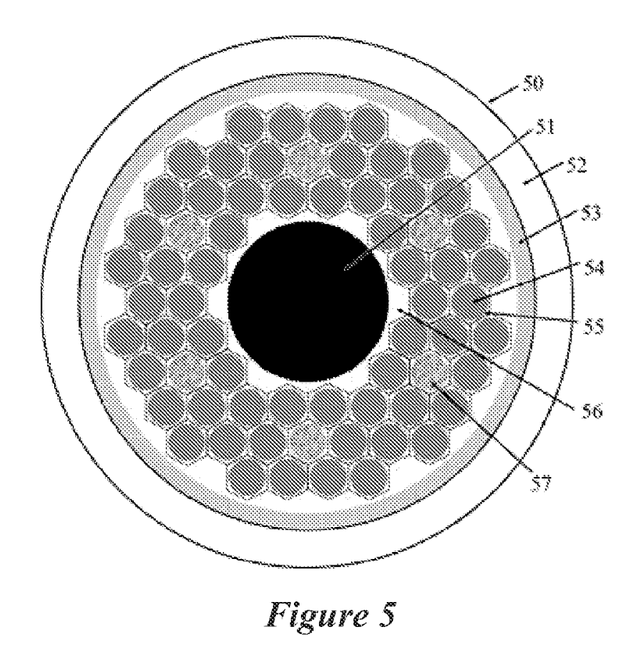
FIG. 5 illustrates a schematic cross section of a modified "rod-restock-process" subelement (before heat treatment) to realize internal oxidation.

Referring now to FIG. 5, in certain embodiments, the superconducting wire precursors can comprise a metallic matrix (for example, a Cu-based metal), and at least one continuous subelement precursor (50) embedded in the matrix. Each subelement can comprise a Sn-based metal core (51) (e.g., a Sn metal rod), a Cu-based layer (56) coaxially disposed around the Sn-based metal core, a plurality of stacked. Cu (55)-encased Nb alloy rods (54) disposed around the Cu-based layer, and a barrier layer (53) coaxially disposed around the stacked Nb alloy rods. A plurality of metal oxide regions (57) can be disposed within the stacked Cu (55)-encased Nb alloy rods. The metal oxide regions (57) can each comprise a metal oxide powder. Each subelement precursor (50) can further include a metallic matrix (52) disposed about the barrier layer.

As discussed above, the composition of the metal oxide and the Nb alloy can be selected in combination so as to facilitate internal oxidation of the Nb alloy upon heat treatment of the superconducting wire precursor. Upon heat treatment of the superconducting wire precursor, Sn from the core can diffuse to the Nb alloy layer (e.g., to the stacked Cu-encased Nb alloy rods), forming a superconducting $Nb_3Sn$ layer (e.g., a plurality of stacked Cu-encased $Nb_3Sn$ rods). The composition of the metal oxide layer and the Nb alloy layer can be selected to provide for the formation of metal oxide particulates disposed within superconducting $Nb_3Sn$ upon heat treatment of the superconducting wire precursor. As described above, the metal oxide particulates can serve to control the grain size of the $Nb_3Sn$ formed during heat treatment, thereby forming a niobium-tin superconducting phase comprising $Nb_3Sn$ grains having a refined average grain size (e.g., from 5 nm to 30 nm).

For example, the Nb alloy layer (e.g., the Nb alloy forming the Nb alloy rods) can comprise an alloy of Nb and a metal that has an oxidation potential greater than the oxidation potential of Nb (e.g., Zr, Al, Ti, Be, etc.). In some examples, the Nb alloy layer can comprise an alloy of Nb and a metal that is less noble than Nb (e.g., a metal that appears lower than Nb in a galvanic series). In certain examples, the Nb alloy layer (e.g., the Nb alloy forming the Nb alloy rods) can comprise a Nb alloy selected from the group consisting of a Nb—Zr alloy, a Nb—Al alloy, a Nb—Ti alloy, and combinations thereof. The Nb alloy (e.g., the Nb alloy forming the Nb alloy rods) can further comprise a dopant to be incorporated into a resulting superconducting phase formed from the Nb alloy. Suitable dopants are known in the art, and include, for example, Ti, Ta, and combinations thereof.

The plurality of metal oxide regions can, in some examples, each comprise a metal oxide that has a lower oxidation potential than $NbO_2$. In some examples, the plurality of metal oxide regions can each comprise a metal oxide that can supply oxygen to Nb. In some examples, the plurality of metal oxide regions each comprise a metal oxide comprising a metal selected from the group consisting of Sn, Cu, Zn, Nb, Fe, Ni, Cr, Co, W, and combinations thereof. In some examples, the plurality of metal oxide regions each comprise a metal oxide selected from the group consisting of $SnO_2$, CuO, ZnO, $Nb_2O_5$, and combinations thereof.

The barrier layer can comprise any suitable material that can inhibit diffusion of the superconducting layer into the metallic matrix. For example, the barrier layer can comprise Nb metal or an alloy thereof, Ta metal or an alloy thereof, Ti metal or an alloy thereof, Mo metal or an alloy thereof, or a combination thereof. In some embodiments, the barrier layer can comprise Nb metal or an alloy thereof. In certain embodiments, the barrier layer can comprise a Nb alloy. Examples of suitable Nb alloys include, but are not limited to, Nb—Zr alloys, Nb—Al alloys, Nb—Ti alloys, Nb—Ta alloys, Nb—Be alloys, Nb—Ni alloys, Nb—Fe alloys, Nb—Sn alloys, and combinations thereof. In some examples, the Nb alloy can be selected from e group consisting of a Nb—Zr alloy, a Nb—Al alloy, Nb—Ti alloy, and combinations thereof.

In some examples, the Nb alloy layer can comprise a plurality of discrete Nb alloy rods, each Nb alloy rod comprising a Nb alloy core ensheathed in copper or a copper alloy. In some examples, the Nb alloy rods are formed into hexed cross sectioned rods, and the Nb alloy layer comprises a plurality of hexagonally packed Nb alloy rods.

In some examples, the plurality of metal oxide regions can comprise a plurality of metal oxide rods, each metal oxide rod comprising a metal oxide core ensheathed in copper or a copper alloy. The metal oxide core can, for example, comprise a metal oxide powder. In some examples, the metal oxide rods are formed into hexed cross sectioned rods to enable their packing among the hexagonally packed Nb alloy rods.

Precursors of this type can be fabricated using standard rod-restack-processes known in the art. See, for example, U.S. Pat. No. 6,981,309, which is hereby incorporated by reference in its entirety. Once formed, the preforms can be formed into a wire by first extruding the preform, followed by either wire-drawing or swaging the extruded preform. Once drawn or swaged, the preform can be re-stacked by repeating the extrusion step, followed by the drawing or swaging steps, to achieve the desired wire diameter. The re-stacking step can be repeated as many times as necessary until the desired wire diameter is obtained.

Methods of Making

Also disclosed herein are methods of making superconducting wires comprising heat treating any of the superconducting wire precursors described herein under conditions effective to form a superconducting wire comprising a superconducting phase comprising $Nb_3Sn$.

Heat treating the superconducting wire precursor can, for example, comprise heating the superconducting wire precursor at a temperature of at least 600° C. (e.g., 625° C. or more, 650° C. or more, 675° C. or more, 700° C. or more, 725° C. or more, 750° C. or more, 775° C. or more, 800° C. or more, or 825° C. or more). In some examples, heat treating the superconducting wire precursor can comprise heating the superconducting wire precursor at a temperature of 850° C. or less (e.g., 825° C. or less, 800° C. or less, 775° C. or less, 750° C. or less, 725° C. or less, 700° C. or less, 675° C. or less, 650° C. or less, or 625° C. or less). The temperature at which the superconducting wire precursor is heated during heat treatment can range from any of the minimum values described above to any of the maximum values described above, for example from 600° C. to 850° C. (e.g., from 600° C. to 725° C. from 725° C. to 850° C., from 600° C. to 650° C., from 650° C. to 700° C., from 700° C. to 750° C., from 750° C. to 800° C., from 800° C. to 850° C., or from 650° C. to 800° C.).

Heat treating the superconducting wire precursor can, for example, comprise heating the superconducting wire precursor for at least 10 minutes (e.g., 20 minutes or more, 30 minutes or more, 40 minutes or more, 50 minutes or more, 1 hour or more, 2 hours or more, 3 hours or more, 4 hours or more, 5 hours or more 10 hours or more, 20 hours or more, 30 hours or more, 40 hours or more, 50 hours or more, 60 hours or more, 70 hours or more, 80 hours or more, 90 hours or more, 100 hours or more, 200 hours or more, 300 hours or more, 400 hours or more, 500 hours or more, 600 hours or more, or 700 hours or more). In some examples, heat treating the superconducting wire precursor can comprise heating the superconducting wire precursor for 800 hours or less (e.g., 700 hours or less, 600 hours or less, 500 hours or less, 400 hours or less, 300 hours or less, 200 hours or less, 100 hours or less, 90 hours or less, 80 hours or less, 70 hours or less, 60 hours or less, 50 hours or less, 40 hours or less, 30 hours or less, 20 hours or less, 10 hours or less, 5 hours or less, 4 hours or less, 3 hours or less, 2 hours or less, 1 hour or less, 50 minutes or less, 40 minutes or less, 30 minutes or less, or 20 minutes or less). The time for which the superconducting wire precursor is heat treated can range from any of the minimum values described above to any of the maximum values described above, for example for from 10 minutes to 800 hours (e.g., from 10 minutes to 400 hours, from 400 hours to 800 hours, from 10 minutes to 200 hours, from 200 hours to 400 hours, from 400 hours to 600 hours, from 600 hours to 800 hours, from 10 minutes to 100 hours, or from 100 hours to 700 hours).

Once formed, the superconducting wires described herein can be formed into similar electrically conducting structures, including, but not limited to, flattened tapes, laminated wires formed from multiple wires, and wound multi-wire cables. Applications for superconducting wires are known in the art, and include, for example, electromagnetic devices such as, but not limited to: superconducting magnets, such as those described in U.S. Pat. No. 6,172,588 to Laskaris et al. which is incorporated herein by reference in its entirety; motors; transformers; and generators. Such electromagnetic devices may in turn be incorporated into larger systems, such as, for example, magnetic resonance imaging systems, particle accelerators, and fusion reactors.

The examples below are intended to further illustrate certain aspects of the systems and methods described herein, and are not intended to limit the scope of the claims.

EXAMPLES

The following examples are set forth below to illustrate the methods and results according to the disclosed subject matter. These examples are not intended to be inclusive of all aspects of the subject matter disclosed herein, but rather to illustrate representative methods and results. These examples are not intended to exclude equivalents and variations of the present invention which are apparent to one skilled in the art.

Efforts have been made to ensure accuracy with respect to numbers (e.g., amounts, temperature, etc.) but some errors and deviations should be accounted for. Unless indicated otherwise, parts are parts by weight, temperature is in ° C. or is at ambient temperature, and pressure is at or near atmospheric. There are numerous variations and combinations of reaction conditions, e.g., component concentrations, temperatures, pressures and other reaction ranges and conditions that can be used to optimize the product purity and yield obtained from the described process.

Example 1

Overview

Refinement of grain size and improvement of high-field critical current density ($J_c$) can be achieved for a $Nb_3Sn$ superconducting wire by internally oxidizing the Nb alloy. In such strands, the Nb alloy can be any Nb alloy where the additional element or elements can be oxidized internally, for example Nb—Zr or Nb—Al. The Nb alloy can also include other components that are not oxidized and that can increase the superconductivity potential, such as Nb doped with Ti, or Nb doped with Ta. An oxide powder can be positioned in the subelements so that during heat treatment the Nb alloy can reduce the oxide powder and take up the oxygen. Internal oxidation of Nb—Zr or Nb—Al alloys can form fine intra-granular and inter-granular $ZrO_2$ or $Al_2O_3$ precipitates in the $Nb_3Sn$ matrix. The $ZrO_2$ or $Al_2O_3$ precipitates can refine the $Nb_3Sn$ grain size (e.g., by a factor of three for a heat treatment temperature of 625° C.). The refined grain size of the $Nb_3Sn$ (~30 nm) can shift the peak of the flux pinning force vs. field ($F_p$-B) curve towards half of the irreversibility field and can improve the high-field $J_c$ (e.g., by a factor of two for a heat, treatment temperature of 625° C.).

Introduction $Nb_3Sn$ superconductors can be used in applications such as nuclear magnetic resonance (NMR), fusion reactors, and particle accelerator magnets. Such applications can require high critical current density ($J_c$) at magnetic fields from 12 T to 20 T or more.

At present there are three types of $Nb_3Sn$ strands that have been reported to have a $J_c$ of ~5000 A/mm$^2$ at 4.2 K and 12 T, namely "rod-restack-process" (See, for example, U.S. Patent Application Publication No. 2006/0081307), "powder-in-tube", and "tube type". Each of the $Nb_3Sn$ strands is composed of a plurality of superconductor units (named "subelements") embedded in a Cu matrix. For example, a subelement of a rod-restack-process strand can contain a Cu-encased Sn core, which can be surrounded by a plurality of Cu-encased Nb alloy rods, a Nb barrier, and another Cu layer. A subelement of a powder-in-tube strand can be a Cu-jacketed. Nb alloy tube filled by Sn-source powders (such as $Cu_5Sn_4$ or a mixture of $NbSn_2$ and Cu powders). A tube type strand is similar to a powder-in-tube strand, but uses a Cu-encased Sn rod as the Sn source instead of Sn-containing powders.

Refining the $Nb_3Sn$ grain size can improve the high-field $J_c$ of the $Nb_3Sn$ superconductors. Present $Nb_3Sn$ conductors, with grain sizes of typically 100-200 nm, have bulk pinning force vs. field curves ($F_p$-B) that peak at 0.2 of the irreversibility field ($B_{irr}$). A previous experiment on $Nb_3Sn$ films fabricated by electron-beam co-evaporation deposition showed that if the $Nb_3Sn$ grain size was refined to 15-30 nm, the peak of the $F_p$-B curve would shift from 0.2 $B_{irr}$ to 0.5 $B_{irr}$. The shift of the $F_p$-B curve peak to 0.5 $B_{irr}$ can improve the high-field (>10 T) $J_c$, which can push the application range of $Nb_3Sn$ conductors to higher fields (>20 T). One report showed that a reduction of the $Nb_3Sn$ grain size improved the 12 T $J_c$ value by a factor of three. The shift of the $F_p$-B curve peak to 0.5 $B_{irr}$ can also reduce the value of $J_c$ below 2 T, which can reduce low-field magnetization and improve the stability of the Nb$_3$Sn conductors.

One method that has been used to control the Nb$_3$Sn grain size has been lowering the reaction temperature. A heat treatment at 600-800° C. can transform precursors, including Sn, Cu, and Nb metals or alloys thereof in a green-state wire to the Nb$_3$Sn phase through a diffusion reaction process. However, even reducing the temperature of 615° C. can only refine the grain size to about 90 nm.

An internal oxidation method that was successfully used in Nb$_3$Sn films offers an alternative. The film approach used a Nb—Zr foil which was first anodized to form a Nb$_2$O$_5$ layer on the surface and then annealed to decompose the Nb$_2$O$_5$ and dissolve oxygen in the Nb—Zr alloy; after being coated with Cu—Sn, the foil was reacted at 1050° C. to form Nb$_3$Sn with ZrO$_2$ precipitates. It was reported that with sufficient oxygen supply, the Nb$_3$Sn grain size could be refined by an order of magnitude.

A lot of effort has been made to transfer this internal oxidation method from foils to Nb$_3$Sn wires. M. Benz (U.S. Pat. No. 6,583,362 to Benz, et al) fabricated a wire with Nb alloy having Zr and oxygen pre-dissolved, and similar work was repeated by B. Zeitlin later. However, pre-dissolving oxygen in the Nb—Zr alloy increased its strength and decreased its ductility, therefore making it difficult to draw the Nb—Zr—O alloy down to a small size. It is worth mentioning here that a Nb$_3$Sn wire is different from a film. First, a Nb$_3$Sn wire has a cross section which can facilitate cabling. Second, the Nb$_3$Sn wire has a peripheral Cu matrix in which all subelements are embedded. Thirdly, several deformations are usually performed on a green-state Nb$_3$Sn wire to obtain a small subelement diameter (typically <60 µm), while such deformations are not needed for the fabrication of a film. Due to these deformations, the precursors to compose a Nb$_3$Sn wire must be sufficiently ductile: it is this point that hinders the transfer of the technique developed for films to the processes for forming wires.

To circumvent the addition of oxygen to the Nb—Zr alloy before processing, Zeitlin fabricated a mono-element internal-tin strand using an oxygen-free Nb—Zr alloy. For the oxygen supply Zeitlin blended a SnO$_2$ powder with a Sn powder in the core, expecting the Nb—Zr to take up the oxygen from SnO$_2$ during heat treatment, because Nb and Zr have stronger affinity to oxygen than Sn. However, no grain refinement was obtained in Zeitlin's samples reacted at or below 850° C. A closer examination of Zeitlin's wire showed that certain features of its structure prevented the transfer of oxygen from the SnO$_2$ to the Nb—Zr. Disclosed herein are several structures in which the internal oxidation of Nb$_3$Sn wires is realized, which leads to a refined grain size and a higher $J_c$ than has been achieved in conventional Nb$_3$Sn strands.

Results and Discussion

Discussed herein are three types of subelement structures of high-$J_c$ Nb$_3$Sn strands (e.g., tube type, powder-in-tube, and rod-restack-process), that are modified so that internal oxidation can occur in these strands during heat treatment to form fine metal oxide particles in the Nb$_3$Sn matrix. All of these strands used a metal oxide powder as the oxygen source, and the oxide powder was located in a position inside each subelement so that it can release sufficient oxygen to oxidize the Zr or Al atoms in the Nb—Zr or Nb—Al alloy during the heat treatment. The fine ZrO$_2$ or Al$_2$O$_3$ particles precipitated in the Nb$_3$Sn matrix refined the Nb$_3$Sn grain size and boosted the high-field $J_c$ of these strands.

Generally speaking, two modifications were made to the Nb$_3$Sn subelements to enable internal oxidation. First, each subelement was fabricated with a Nb alloy (herein denoted as Nb-M) that can be internally oxidized. The Nb alloy can have additional elements that are not oxidized, such as Ti or Ta, and that can increase the superconductor potential. Second, each subelement contained an oxygen source that can supply oxygen to the Nb-M alloy during heat treatment. Metal M in the Nb-M alloy can have sufficient solubility in Nb so that it can form a Nb-M solid solution with a sufficient amount of M. Further, Metal M can be less noble than Nb so that during heat treatment the metal M is oxidized while Nb itself is left behind for the formation of Nb$_3$Sn. Furthermore, the less noble a metal is, the finer its oxide precipitates (e.g., the internal oxidation products) are. Ti, Zr and Al can all be used as the metal M, meaning the Nb-M alloy can be Nb—Ti, Nb—Zr, or Nb—Al, which would result in TiO$_2$, ZrO$_2$, and Al$_2$O$_3$ precipitates, respectively.

The oxygen source was introduced into the strands discussed herein by adding a metal oxide powder into the subelements, taking advantage of the good flowability of powders during the drawing process. For Nb$_3$Sn strands, Cu was used as a matrix, but also inside the subelements, because Cu destabilizes high-Sn Nb—Sn compounds and promotes Nb$_3$Sn formation. However, calculations show that the diffusion rate of oxygen in Cu can be very slow because of the low oxygen solubility in Cu. Thus, for the design of the subelement structure for internal oxidation, having oxygen diffuse through a thick Cu layer was avoided.

One example for the realization of internal oxidation in a tube type subelement is illustrated in FIG. 2. The subelement (12) is comprised of five concentric layers, namely, the Cu matrix (21), the Nb—Zr or Nb—Al alloy tube (22), the oxide layer (23), the Cu layer (24), and the central Sn rod (25). The oxide layer (23) is located between the Cu layer (24) and the Nb alloy tube (22) so that the Nb alloy can reduce the oxide powder and take up the oxygen during heat treatment. If the oxide powder was located between the Cu layer (24) and the central Sn rod (25), excess heat treatment time can be needed to supply sufficient amount of oxygen to Nb—Zr alloy through the Cu layer (24). If the oxide powder was located between the Nb alloy tube (22) and the Cu matrix (21), the vacant space left in the oxide powder layer after reaction can block the current transfer from the Cu matrix (21) to the Nb$_3$Sn layer. An example wire containing a plurality of subelements (12) is shown in FIG. 1. Referring now to FIG. 1, the wire (10) comprises a plurality of subelements (12), as well as Cu matrix (11), and can further comprise a certain number of Cu hexagons (13), which can be located in the center of the wire (10) to ease wire drawing. Note that FIG. 1 shows a schematic view of an exemplary configuration, and is not meant to be limiting. For example, the wire can include any number of subelements (e.g., over a hundred).

Figure 3:
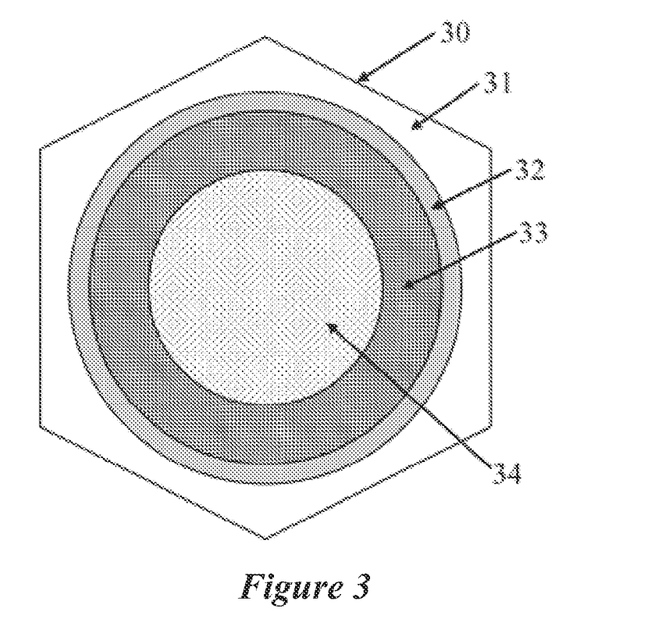
FIG. 3 illustrates a schematic representation of a modified "tube type" subelement (after heat treatment) to realize internal oxidation.

Heat treatment of the tube type subelement (12) in FIG. 2 can convert the subelements to those as shown in FIG. 3. The heat treatment can transform the oxide layer (23), the Cu layer (24), and the central Sn rod (25) in FIG. 2 to the non-superconducting core (34) in FIG. 3. The subelement (30) of FIG. 3 further comprises a superconducting Nb$_3$Sn layer (33) with ZrO$_2$ or Al$_2$O$_3$ particles formed therein, and a layer of Nb—Zr or Nb—Al alloy (32) is left unreacted to protect the Cu matrix (31).

In order for the metal oxide powder to be reduced by the Nb alloy, the metal oxide should be less stable than Nb oxide. Examples of metal oxides that can supply oxygen to the Nb alloy include, but are not limited to, SnO$_2$, ZnO, $Nb_2O_5$, and CuO. $SnO_2$ powder can, for example, supply its oxygen to the Nb alloy until the $SnO_2$ completely exhausts its oxygen content and turns into liquid Sn. On the other hand, $Nb_2O_5$ can only supply a portion of its oxygen to the Nb alloy while the $Nb_2O_5$ powder transforms to $NbO_2$, which cannot supply oxygen to the Nb alloy. On the other hand, if the oxide is too unstable (e.g., CuO), the rate at which the oxygen is supplied by this oxide can be faster than the rate at which the oxygen diffuses deeper into the Nb alloy, making the oxygen content at the Nb alloy surface rise with time. A sufficient oxygen content at the Nb alloy surface can oxidize both Nb and Zr non-selectively, which is adverse to the formation of $Nb_3Sn$. Such issues are more frequently observed at higher heat treatment temperatures. To avoid these problems, a pre-heat treatment stage at a lower temperature (e.g., 500° C.) can be added, or a more stable oxide (e.g., $Nb_2O_5$) can be used.

FIG. 4 displays an example powder-in-tube subelement for the realization of internal oxidation. The subelement (40) is comprised of a Cu (41)-jacketed Nb—Zr or Nb—Al alloy tube (42), which is filled with a mixture (43) of a metal oxide powder and a Cu—Sn or Nb—Sn intermetallic powder, which can serve as the Sn source. During heat treatment, the metal oxide powder in the core can release oxygen for the Nb alloy (42) to be internally oxidized. Regarding the transfer of oxygen from oxide powder to Nb alloy, experiments demonstrated that the oxide powder does not need to contact the Nb alloy to supply oxygen. As long as the metal oxide powder is exposed to the atmosphere, a metal oxide powder like $SnO_2$ or $Nb_2O_5$ can supply oxygen to Nb alloy through the atmosphere. As shown in FIG. 4, the metal oxide powder in the core can be blended with the Sn-source powder and thus does not contact the Nb alloy tube, but it can still supply oxygen to Nb alloy. If a $Nb_6Sn_5$ or $Nb_3Sn$ phase begins to form at the inner surface of the Nb alloy tube (42), the newly formed $Nb_6Sn_5$ or $Nb_3Sn$ layer can cut off the connection between the oxide powder and the unreacted Nb alloy, and thus terminate the oxygen transfer process. This can be avoided by adding a pre-heat treatment stage at a lower temperature (e.g., 500° C.), which can allow oxygen transfer but postpones the formation of the $Nb_6Sn_5$ or $Nb_3Sn$ phase.

FIG. 5 displays a schematic representation of a modified rod-restack-process subelement (50) that enables internal oxidation. The subelement (50) comprises a Sn core (51), a Cu can (56), a Nb alloy barrier (53), a Cu matrix (52), and a stacking of Cu (55)-encased Nb—Zr or Nb—Al alloy rods (54), a certain number of which are replaced by a metal oxide powder (57). As mentioned earlier, the diffusion rate of oxygen through the Cu layer is slow, so supplying oxygen through a thick Cu layer tends to cause an insufficient amount of oxygen for oxidizing the Zr or Al atoms in the Nb—Zr or Nb—Al alloy. However, in a final-size rod-restack-process strand, the thickness of the Cu layer among the Nb alloy rods (54) is small (e.g., less than 1 µm), which can allow rapid transfer of oxygen from the oxide powder to the surrounding Nb alloy rods. For this example, CuO powder can be used as the metal oxide powder.

Figure 6:
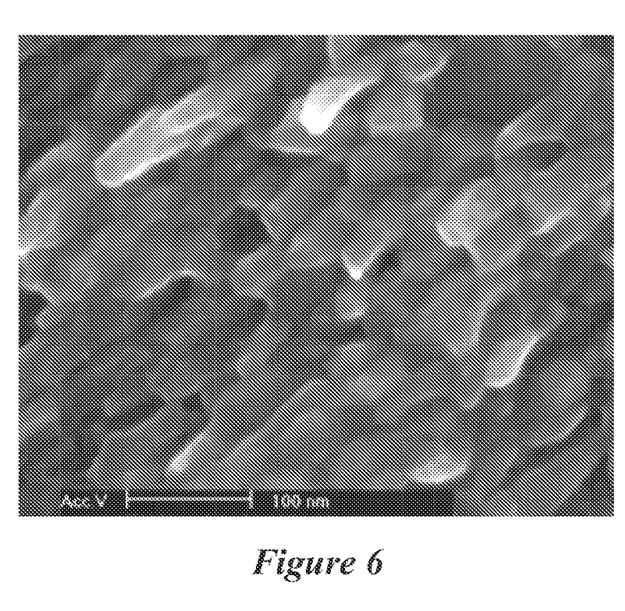
FIG. 6 shows scanning electron microscopy (SEM) image of $Nb_3Sn$ grains of a tube type subelement with Nb—1Zr alloy and $SnO_2$ powder, after being heat treated at 625° C. for 800 hours.

An experimental tube type subelement that has a structure as shown in FIG. 2 was fabricated. The Nb alloy used for the tube (22) was commercial Nb-1Zr, and the oxide powder used was $SnO_2$. The outer diameter of the Nb-1Zr tube in the final-size subelement was 0.22 mm. The wire was heat treated at 625° C. for 800 hours. It was found that over 3 atomic percent (at. %) oxygen was taken up by the Nb—Zr alloy after the heat treatment. An SEM image displaying the $Nb_3Sn$ grains of this wire is shown in FIG. 6. It was calculated that the average $Nb_3Sn$ grain size was about 36 nm, which is about a third of the present $Nb_3Sn$ strands reacted at 625° C. (100-110 nm), The 4.2 K, 12 T $Nb_3Sn$-layer c of this wire was 9600 A/mm$^2$, which is almost double the value of the present state-of-the-art $Nb_3Sn$ strands (~5000 A/mm$^2$). The peak of the $F_p$-B curve of this wire shifted to 0.34 $B_{irr}$. Further improvement (e.g., by a factor of six for 15 T $J_c$) can be achieved by further optimizing this value of this subelement (~20 T) can be improved by additions of Ta or Ti, Second, the grain size can be further reduced with the use of even lower reaction temperatures (e.g., 605° C.), or higher Zr content (e.g., 1.5%) to produce a greater density of $ZrO_2$ particles. A Nb—Al solid solution, which is a ductile alloy, can give a different distribution of oxide particles and can affect the grain size refinement differently.

The compositions and methods of the appended claims are not limited in scope by the specific compositions and methods described herein, which are intended as illustrations of a few aspects of the claims. Any compositions and methods that are functionally equivalent are intended to fall within the scope of the claims. Various modifications of the compositions and methods in addition to those shown and described herein are intended to fall within the scope of the appended claims. Further, while only certain representative compositions and methods disclosed herein are specifically described, other compositions and methods also are intended to fall within the scope of the appended claims, even if not specifically recited. Thus, a combination of steps, elements, components, or constituents may be explicitly mentioned herein or less, however, other combinations of steps, elements, components, and constituents are included, even though not explicitly stated.

The term "comprising" and variations thereof as used herein is used synonymously with the term "including" and variations thereof and are open, non-limiting terms. Although the terms "comprising" and "including" have been used herein to describe various embodiments, the terms "consisting essentially of" and "consisting of" can be used in place of "comprising" and "including" to provide for more specific embodiments of the invention and are also disclosed. Other than where noted, all numbers expressing geometries, dimensions, and so forth used in the specification and claims are to be understood at the very least, and not as an attempt to limit the application of the doctrine of equivalents to the scope of the claims, to be construed in light of the number of significant digits and ordinary rounding approaches.

Unless defined otherwise, all technical and scientific terms used herein have the same meanings as commonly understood by one of skill in the art to which the disclosed invention belongs. Publications cited herein and the materials for which they are cited are specifically incorporated by reference.

What is claimed is:
1. A superconducting wire comprising:
a matrix comprising a Cu-based metal; and
at least one continuous subelement embedded in the matrix;
wherein each subelement comprises:
a non-superconducting core;
a superconducting layer coaxially disposed around the non-superconducting core; and
a barrier layer coaxially disposed around the superconducting layer;

wherein the superconducting layer comprises a plurality of $Nb_3Sn$ grains stabilized by metal oxide particulates disposed therein, wherein the $Nb_3Sn$ grains have an average grain size of from 5 nm to 90 nm; and wherein the superconducting layer has a flux pinning force vs. field ($F_p$-B) curve that peaks at from 0.2 to 0.5 times the irreversibility field ($B_{irr}$).

2. The superconducting wire of claim 1, wherein the $Nb_3Sn$ grains have an average grain size of from 15 nm to 50 nm.

3. The superconducting wire of claim 1, wherein the superconducting layer further comprises a dopant.

4. The superconducting wire of claim 3, wherein the dopant comprises Ti, Ta, or a combination thereof.

5. The superconducting wire of claim 1, wherein the superconducting layer has a high-field critical current density ($J_c$) of from 5,000 to 21,000 A/mm$^2$ at a temperature of 4.2 K in a magnetic field of 12 T.

6. The superconducting wire of claim 1, wherein the barrier layer comprises a Nb alloy, a Ta alloy, a Ti alloy, or a combination thereof.

7. The superconducting wire of claim 6, wherein the barrier layer comprises a Nb alloy, and the Nb alloy comprises an alloy of Nb and a metal that has an oxidation potential greater than the oxidation potential of Nb.

8. The superconducting wire of claim 1, wherein the superconducting layer comprises a Nb alloy, and the Nb alloy is selected from the group consisting of a Nb—Zr alloy, a Nb—Al alloy, a Nb—Ti alloy, and combinations thereof.

9. The superconducting wire of claim 1, wherein the metal oxide particulates comprise a metal that has an oxidation potential greater than the oxidation potential of Nb.

10. The superconducting wire of claim 1, wherein the metal oxide particulates comprise a metal oxide selected from the group consisting of $ZrO_2$, $Al_2O_3$, $TiO_2$, and combinations thereof.

11. The superconducting wire of claim 1, wherein the diameter of each subelement is from 5 μm to 150 μm.

12. The superconducting wire of claim 1, wherein the metal oxide particulates comprise a metal selected from the group consisting of Sn, Cu, Zn, Nb, Fe, Ni, Cr, Co, W, and combinations thereof.

13. The superconducting wire of claim 1, wherein the non-superconducting core comprises Sn metal or an alloy thereof.

* * * * *